United States Patent [19]

Aranda et al.

[11] Patent Number: 5,257,237
[45] Date of Patent: Oct. 26, 1993

[54] SAM DATA SELECTION ON DUAL-PORTED DRAM DEVICES

[75] Inventors: Michael A. Aranda; Andrew D. Bowen, both of Saugerties; Timothy J. Ebbers, Shokan; Randall L. Henderson, West Hurley, all of N.Y.; Nathan R. Hiltebeitel, Essex Junction; Robert Tamlyn, Jericho, both of Vt.

[73] Assignee: International Business Machines Corporation, Armonk, N.Y.

[21] Appl. No.: 791,666

[22] Filed: Nov. 12, 1991

Related U.S. Application Data

[63] Continuation-in-part of Ser. No. 352,442, May 16, 1989, Pat. No. 5,065,368.

[51] Int. Cl.$^5$ .............................................. G11C 8/00
[52] U.S. Cl. ........................... 365/230.05; 365/189.12; 365/239
[58] Field of Search ...................... 365/230.05, 189.12, 365/239

[56] References Cited

U.S. PATENT DOCUMENTS

| | | | |
|---|---|---|---|
| 4,541,075 | 9/1985 | Dill et al. ............................. | 365/189 |
| 4,819,209 | 4/1989 | Takemae et al. ..................... | 365/230 |
| 4,825,411 | 4/1989 | Hamano ............................... | 365/189 |
| 4,855,959 | 8/1989 | Kobayashi ........................... | 365/239 |
| 4,870,621 | 9/1989 | Nakada ............................. | 365/230.05 |
| 4,891,794 | 1/1990 | Hush et al. ....................... | 365/239 X |
| 4,922,457 | 5/1990 | Mizukami ....................... | 365/189.01 |
| 4,984,214 | 1/1991 | Hiltebeitel et al. ............. | 365/230.05 |
| 5,001,672 | 3/1991 | Ebbers et al. .................. | 365/230.05 |
| 5,014,242 | 5/1991 | Akimoto et al. .......... | 365/230.05 X |
| 5,065,368 | 11/1991 | Gupta et al. .................. | 365/230.05 |
| 5,065,369 | 11/1991 | Toda ............................... | 365/230.05 |

OTHER PUBLICATIONS

Quarterly Business Meeting, IBM First Presentation, "Minutes of Meeting No. 50, JC-42.3 Committee on MOS Memories," May 17, 1989, San Diego Hilton, San Diego, Calif.

Quarterly Business Meeting, IBM First and Second Presentations, "Minutes of Meeting No. 51, JC-42.3 Committee on MOS Memories," Sep. 12, 1989, Washington, D.C.

Special Task Group Meeting, Jul. 13, 1989, Joint Electronic Devices Engineering Council (JEDEC), JC-42.3. "4 MB VRAM Summary to JEDEC Committee 42.3."

"Improved Video RAM Read Transfer Cycle", IBM Technical Disclosure Bulletin, vol. 34, No. 1, Jun. 1991 (pp. 479-480).

"Improved Method of Data Transfer Using Large Dual-Ported Memories", IBM Technical Disclosure Bulletin, vol. 33, No. 12, May 1991 (pp. 45-49).

"Using VRAM For a Fast Read/Modify/Write", Research Disclosure, Feb. 1991 (p. 82).

Primary Examiner—Eugene R. LaRoche
Assistant Examiner—Do Hyun Yoo
Attorney, Agent, or Firm—Heslin & Rothenberg

[57] ABSTRACT

The selection in a dual port memory device of data from a serial access memory register having a lower byte and an upper byte of data is described herein. In one embodiment, the register is partitioned lengthwise into two sections, corresponding to, for example, a frame buffer A and a frame buffer B. On each serial clock cycle, frame buffer A or frame buffer B for each byte of data may be selected from the register. Each of the selected bytes of data are then passed to a serial output port. In another embodiment, the lower byte of data corresponds to, for example, a frame buffer A and the upper byte corresponds to a frame buffer B. Then either the upper byte or lower byte of data is selected to be output on the serial port. In yet a further embodiment, the serial access memory register is partitioned lengthwise into two sections, each section corresponding to, for example, a frame buffer and the bytes of data correspond to another buffer, then either the lower byte or upper byte is selected to be output on the serial port.

18 Claims, 6 Drawing Sheets fig. 1a fig. 1b fig. 2a fig. 2b fig. 3 fig. 5 fig. 7 fig. 4 fig. 6

SAM DATA SELECTION ON DUAL-PORTED DRAM DEVICES

CROSS-REFERENCE TO RELATED APPLICATION

This is a continuation-in-part of application Ser. No. 07/352,442 filed May 16, 1989, entitled "VIDEO RAM DOUBLE BUFFER SELECT CONTROL", U.S. Pat. No. 5,065,368.

TECHNICAL FIELD

The present invention relates to semiconductor memories, and more particularly to the selection of data stored in dual-port memories.

BACKGROUND ART

Dual-ported dynamic random access memory (DRAM) devices are used, for example, for storing picture data to be input to a cathode ray tube. The picture data is randomly accessed to write or update the image in memory and then subsequently accessed serially to generate the image on a cathode ray tube. A memory of this type can store images captured by a video camera or other scanning device or it may be used to store images generated by a graphics system.

The image to be displayed is divided into a number of discrete picture elements or pixels. Each pixel represents a physical position on the output display monitor and can have associated with it a color or specific shade of gray. In image and graphics systems, the pixels of a display are each represented by a value stored in the memory device. This memory representation of a display is typically referred to as a frame buffer. A high resolution display typically has an image of 1280 × 1024 or 1,310,720 pixels. Each pixel value can be represented by 1 to 24 or more bits thus requiring a large amount of memory to store the image. This requirement for large amount of high speed memory leads to the use of the highest density memory parts available for graphic system devices. Typically, DRAMs provide the highest memory density. Due to the nature of video display scan patterns and update rates, a need for even faster access times and a need to decouple the updating of the frame buffer from the scanning out of the stored values (through video generation circuitry) for display on the video monitor was realized.

Video Random Access Memories (VRAM) are a specialized form of DRAMs. They were designed to solve the problem of simultaneously displaying the contents of a graphics frame buffer to the screen while allowing the graphics or image processor to update the frame buffer with new data. Video RAMs contain two Input/Output ports (one for random access and one for serial access) and one address port. These memories are frequently referred to as dual-port memories. In addition to the standard DRAM random access array of rows and columns, a serial access memory (SAM) register has been added to support serial input and output.

Video RAMs of this type are known in the prior art, for example U.S. Pat. No. 4,541,075 to Dill, et al., describes such a memory device. The graphics or image processor updates the frame buffer by writing into the random access array. The serial access memory register is designed to sequentially shift the contents of its buffer to the display independently of the random access array. The only time the random array and the SAM do not operate independently is when the SAM needs to be loaded with new data from the random array. The SAM is loaded by executing a special memory cycle called a read data transfer which copies an entire row or a portion of a row of the data to be sequentially clocked out of the SAM into circuitry which updates the screen.

Second generation VRAMs were enhanced with the ability to transfer data from the DRAM array into half of the SAM, while the other half of the SAM is being scanned out to the display. This is known as a split read transfer. An output status pin known as QSF is sometimes provided to indicate the half of the SAM being scanned out.

In some systems there are two frame buffers, with one being scanned out to the screen while the other is being updated by the graphics or image processor. This is frequently referred to as a double buffered system. The use of two buffers avoids the problem of scanning a partially updated image to the screen resulting in undesirable partial images. In double buffered systems, the two frame buffers are referred to as frame buffer A, FBA, and frame buffer B, FBB.

One application of graphics displays is to segment the screen into a plurality of windows which are independent portions of the screen. Since each window is independent of the others, the current update buffer and the display buffer may differ for different windows. Thus, at any moment in time, one window can be using frame buffer A for update and frame buffer B for display while another window can be using the reverse. This leads to the requirement that the scan out buffer be selectable on a per pixel basis.

Figure 1A:
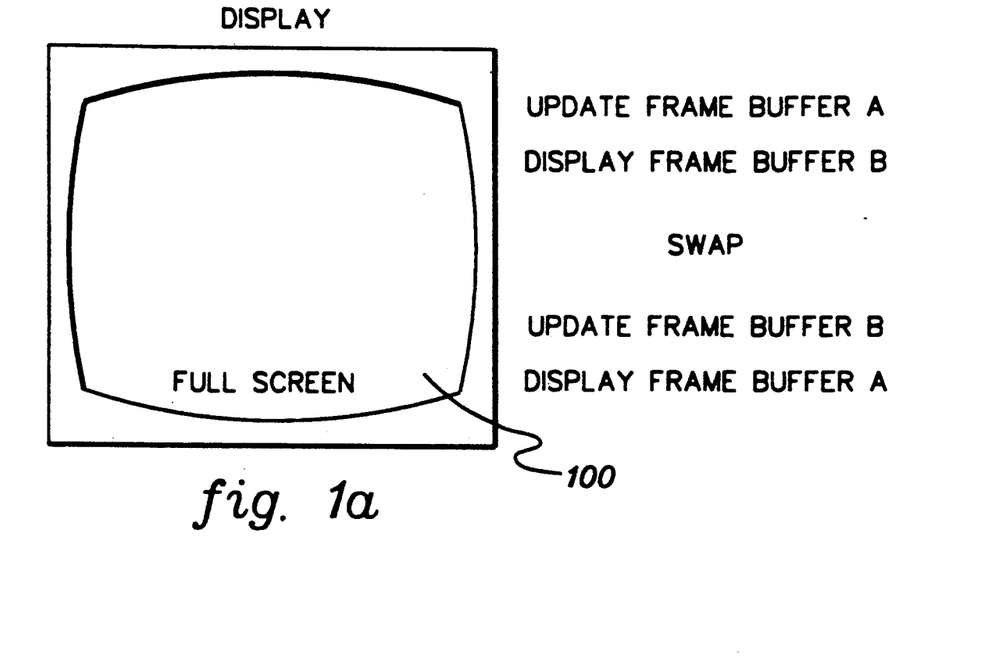
FIG. 1A illustrates the use of two frame buffers with a full screen display.

A graphics system that does not employ windowing, may have a single full screen display 100 as shown in FIG. IA. The contents of one frame buffer, for example frame buffer B, is displayed while the contents of a second one, frame buffer A is updated. At a certain point in time, the designation of the buffers is swapped so that the contents of frame buffer A is displayed while the contents of frame buffer B is updated.

Figure 1B:
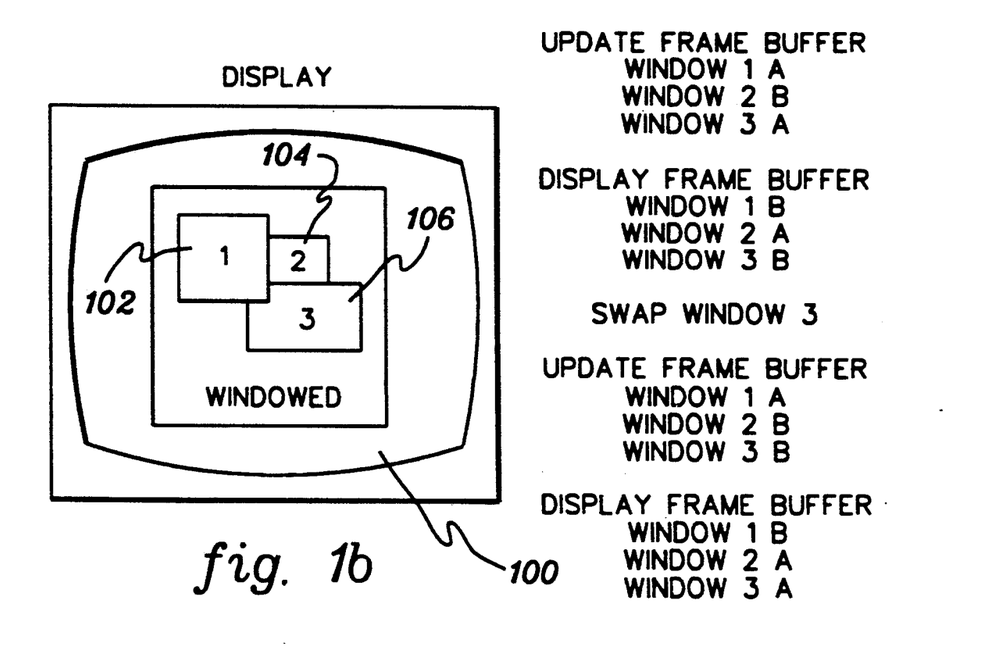
FIG. 1B illustrates the use of windows and double frame buffers.

FIG. 1B illustrates the use of a windowed system. Full screen 100 may be made up of windows such as those labeled 102, 104 and 106. Each application will maintain an indication of which frame buffer is being used for update and which is being used for display. Initially window 1 may be associated with updating frame buffer A, window 2 frame buffer B, and window 3 frame buffer A. The initial display is window 1 from frame buffer B, window 2 from frame buffer A, and window 3 from frame buffer B. Upon the swapping of window 3 between frame buffers, updates for window 1 are into frame buffer A, window 2 frame buffer B, and window 3 frame buffer B, while the display is from frame buffer B, frame buffer A, and frame buffer A, respectively.

One method of implementing double buffered systems is to put the two frame buffers in separate VRAMs. With separate VRAMs it is relatively easy to synchronize the two SAM registers and select pixel data from one or the other VRAM on a per pixel basis. This can be done, for example, by using the Serial Output Enable control pin to only enable the data from the desired frame buffer. However, by placing the frame buffers in separate VRAMS, the cost of the frame buffer will be increased or the drawing rate to the frame buffer will be reduced. Additionally, this design can lead to problems with bus contention if the turn on time of the serial drivers of one VRAM is faster than the turn-off time of the serial drivers of the other VRAMS.

Another method of implementing double buffered systems is described in commonly assigned U.S. patent application Ser. No. 07/352,442, filed May 16, 1989, entitled "Video Ram Double Buffer Select Control", now U.S. Pat. No. 5,065,368, the disclosure of which is incorporated herein by reference. In that application, a serial access memory having a low data register and a high data register memory is described. The low data register represents frame buffer A and the high data register represents frame buffer B, and a select pin is used to select data from either the low data register or the high data register. This design, however, eliminates split read transfer because both the low and high data registers are active at the same time. Therefore, a need exists for extending the SAM data selection approach of U.S. Pat. No. 5,065,368 such that the capability of split read transfer is maintained. A need also exists for providing data selection on a per byte per serial clock cycle basis.

DISCLOSURE OF INVENTION

The shortcomings of the prior art are overcome and additional advantages are provided in accordance with the principles of the present invention through the provision of an improved SAM data selection approach on dual-ported dynamic random access memories.

In accordance with the principles of the present invention, a dual-port memory including a random access memory means having a plurality of rows and columns of data elements, a first serial access memory means receiving a first portion of an accessed row of data elements and a second serial access memory means receiving a second portion of an accessed row of data elements are provided. One of the first or second serial access memory means is selected for serial data readout. A first address is generated to access a plurality of data elements from the selected serial access memory means such that a first sequence of accessed elements is provided. In addition, a second address is generated to access a plurality of data elements from the selected serial access memory means such that a second sequence of accessed elements is provided. Thereafter, one of the first or second sequence of elements is selected and output on a serial output port.

In another aspect of the invention, a method of serially accessing data elements stored in a memory array is provided. This method includes accessing a row of data elements at random by a row address, loading a portion of the accessed row into a first serial access memory register and a second portion of the accessed row into a second serial access memory register. One of the serial access memory registers is selected and then an address is generated to access a first plurality of data elements from the selected register such that a first sequence of accessed data elements is provided. An address is also generated to access a second plurality of data elements from the selected register such that a second sequence of accessed data elements is provided. Subsequently, one of the sequence of elements is selected and output on a serial output port.

The dual-port memories and methods of serial accessing data elements described herein advantageously maintain the capability of using split read transfer. In one embodiment, the dual-port memory maintains split read transfer and is organized such that data may be advantageously selected on a per byte per serial clock cycle. In another embodiment, split read transfer is also maintained and an additional advantage of maintaining the full number of addressable locations is realized. In yet a further embodiment, the dual-port memory is designed such that quad-buffering may be implemented and this design advantageously allows the access of two buffers or data items per cycle on the random access side and the scanning out of one buffer or data item per cycle on the serial side.

BRIEF DESCRIPTION OF DRAWINGS

The subject matter which is regarded as the invention is particularly pointed out and distinctly claimed in the claims at the conclusion of the specification. The invention, however, may best be understood by reference to the following detailed description taken in conjunction with the accompanying drawings in which:

BEST MODE FOR CARRYING OUT THE INVENTION

Figure 2A:
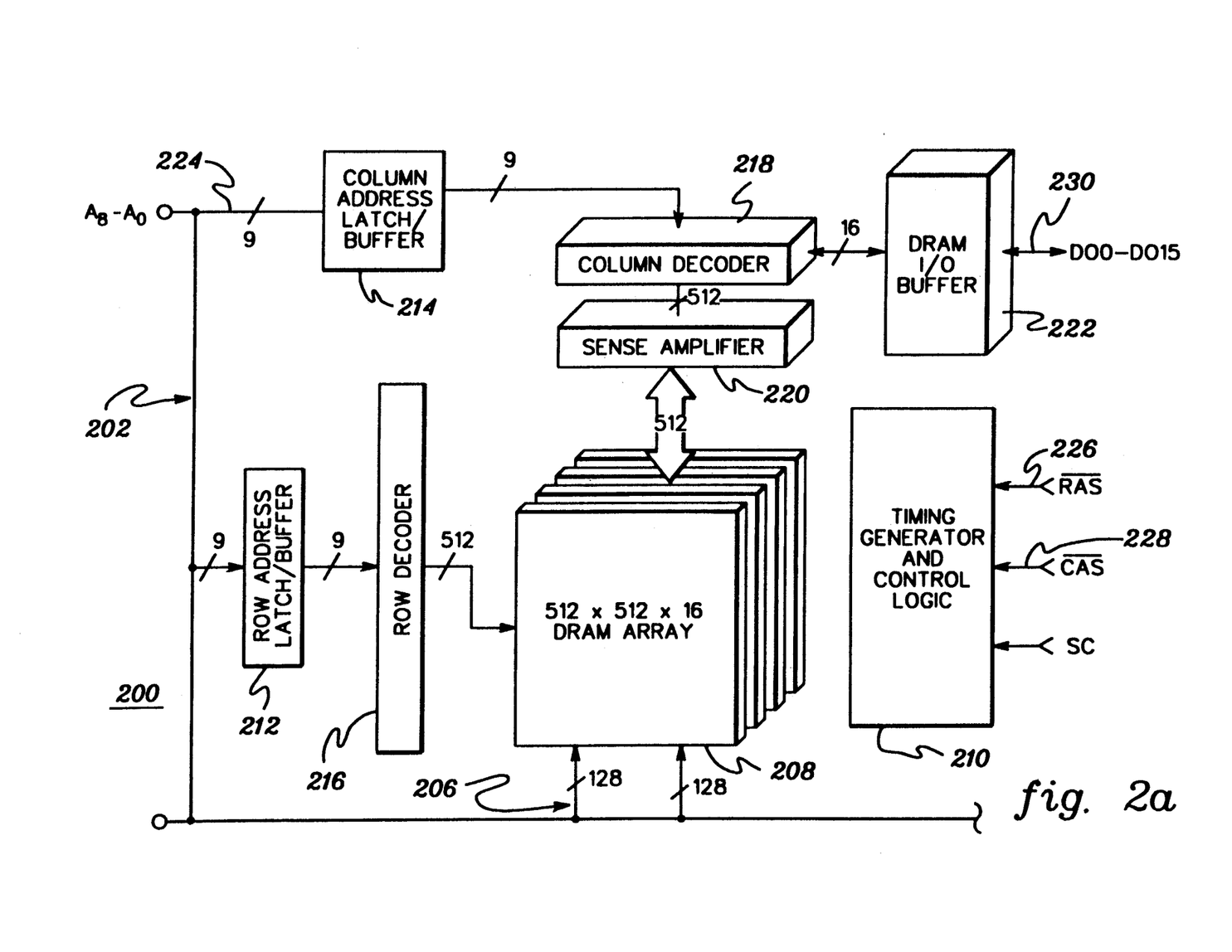
FIGS. 2A and 2B are block diagrams of one example of a video random access memory.
Figure 2B:
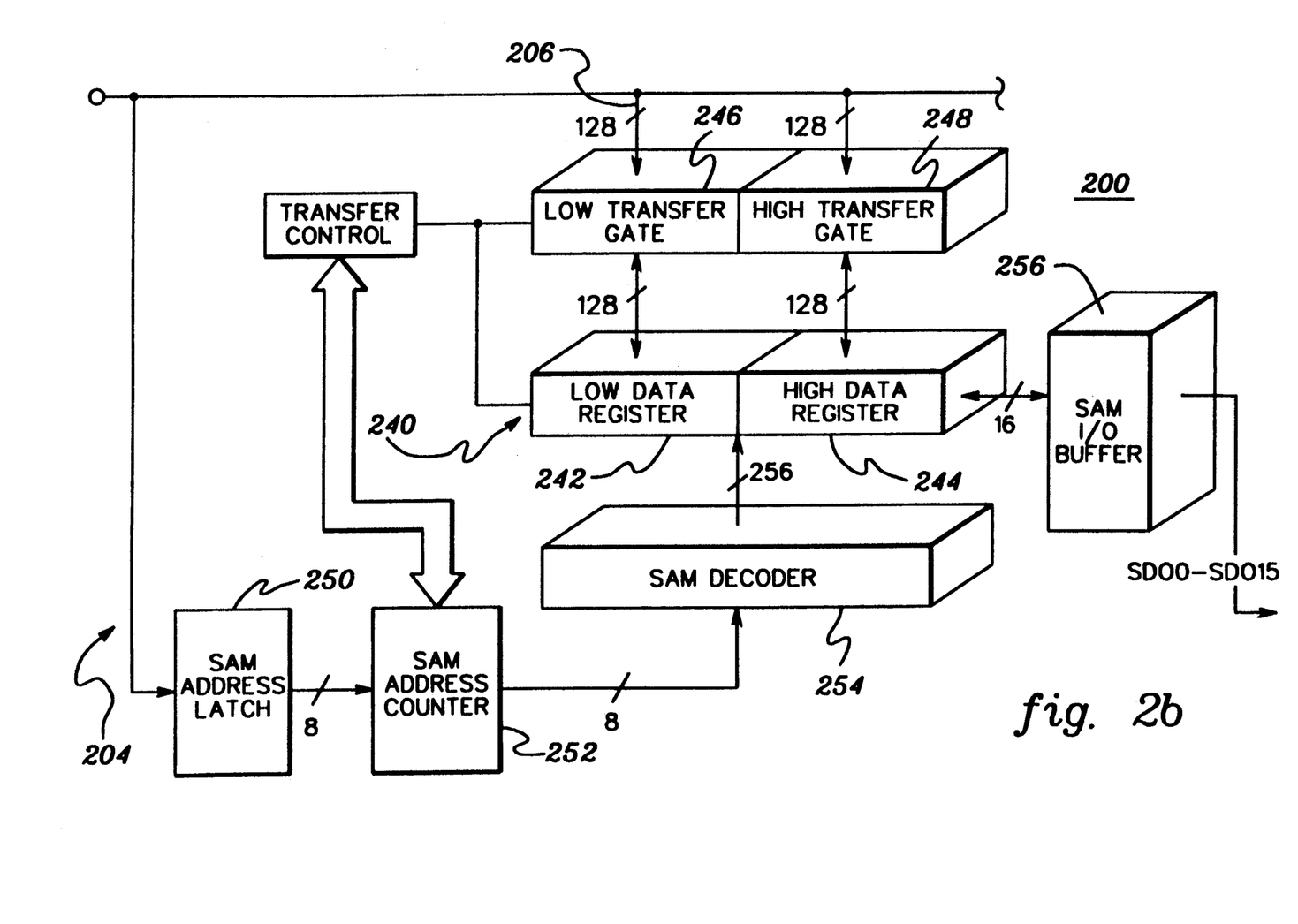

One embodiment of a video random access memory (VRAM) 200 of the present invention is depicted in FIGS. 2a and 2b. As is known, a VRAM generally consists of a dynamic random access memory (DRAM) portion 202 (FIG. 2a) and a serial access memory (SAM) portion 204 (FIG. 2b). Generally, DRAM portion 202 includes a DRAM array 208 having a number of memory cells, a timing generator and control logic 210, a row address latch 212, a column address latch 214, a row decoder 216, a column decoder 218, a sense amplifier 220 and a DRAM I/0 buffer 222. In order to indicate which memory cell in array 208 is to be written to or read from, a row address and a column address are used. In particular, the row and column addresses are input on input pins $A_8$–$A_0$ and are multiplexed on address lines 224. As is known, control signals RAS 226 and CAS 228 determine via timing generator and control logic 210 when to latch either the row address or column address into its respective row address latch 212 or column address latch 214. The latched address is then decoded by its respective row decoder 216 or column decoder 218 to indicate which memory cell is to be accessed. Subsequently, the output signal of column decoder 218 is coupled to a standard sense amplifier 220 in order to amplify the output signal and select the desired memory cell. After the cell is selected, data may be read from or written to the cell using, for example, data I/O lines D00-D015 labelled 230 via DRAM I/O Buffer 222.

Conceptually, in one embodiment, array 208 is represented by one 3-dimensional array in which the array has 512 rows, 512 columns and a depth of sixteen bits ($512 \times 512 \times 16$). As implemented, however, array 208 consists of sixteen 2-dimensional arrays each having 512 rows and 512 columns. Associated with each 2-dimensional array is a respective row and column address latch, row and column address decoder and sense amplifier which are used to write data to or read data from memory cells located within each array. Although a $512 \times 512 \times 16$ array is described herein, it will be apparent to those of ordinary skill in the art that array 208 is not constrained to any particular density or organization.

As previously mentioned, VRAM 200 also consists of SAM portion 204 (FIG. 2b). SAM portion 204 includes a SAM array 240 having a low data register 242 and a high data register 244, a low transfer gate 246 coupled at one end to low data register 242 and at the other end to DRAM array 208 via line 206, a high transfer gate 248 coupled at one end to high data register 244 and at the other end to DRAM 208 also via line 206, a SAM address latch 250, a SAM address counter 252, a SAM decoder 254 and SAM I/O Buffer 256.

Similar to array 208, conceptually, in one embodiment, SAM array 240 is represented by one 3-dimensional array in which the array has 1 row, 256 columns (the SAM is a half-width SAM and thus, can only receive half of a row of array 208) and a depth of sixteen bits ($1 \times 256 \times 16$). The 16-bit depth represents a 16 bit word, wherein the word has an upper and lower byte of data. In one implementation, the 3-dimensional array consists of, for instance, sixteen 2-dimensional arrays each having one row and 256 columns ($1 \times 256$). Each 2-dimensional SAM array corresponds to a respective 2-dimensional DRAM array and associated with each SAM array is a low and high transfer gate, low and high data register and SAM decoder. It will be apparent to those of ordinary skill in the art, that while a half-width SAM array is described herein, the invention is not limited to a half-width array but may be, for instance, a full-width SAM array.

In one operational example of VRAM 200, data is transferred from DRAM array 208 to SAM array 240. In particular, in one example, a half-row of data (corresponding to addresses 0–255 or 256–511) is transferred from the DRAM array to the SAM array via a read transfer operation. In order to determine which columns of which row of the DRAM array are to be transferred, a row address is used to select the row and the most significant bit of the latched column address, e.g. $CA_8$, is used to determine which half of the row is to be transferred. In other words, if $CA_8 = 0$, then the first 256 words (corresponding to columns 0–255) of a selected row of the DRAM array are transferred to the SAM array, and if $CA_8 = 1$, then the next 256 words (corresponding to columns 256–511) are transferred.

Each selected half row of 256 words may further be divided via a split transfer operation. That is, 128 words of each selected half row are transferred to low data register 242 of SAM array 240 via low transfer gate 246 and the other 128 words are transferred to high data register 244 via high transfer gate 248. The second most significant bit of the column address, e.g. $CA_7$, is then used to determine whether low data register 242 or high data register 244 is being accessed. Although the split transfer operation is advantageously utilized in the embodiments of the invention described herein, the invention is not limited to using this operation.

The starting address, or tap, to be used for the first access of the SAM array is generally the column address which is input on lines $A_8$–$A_0$. The column address is latched into SAM address latch 250 and is thereafter loaded into SAM address counter 252. The output of the SAM address counter is coupled to SAM decoder 254 which decodes the address and passes the decoded address to the SAM array. The decoded address is then used to point to a particular memory location in the SAM array. The data found at that location is selected and output on serial data input/output lines SD00–SD015 via SAM I/O buffer 256.

As described previously, in image and graphics systems, it is desirable to have a double buffered system in which one frame buffer, e.g. frame buffer A, for a given pixel is being scanned out to the screen while another frame buffer, e.g. frame buffer B, for the same pixel is being updated by the graphics or image processor. The frame buffers for each pixel may contain a number of bits. For instance, if each pixel has associated with it different 8-bit intensities of the color components red and green, then sixteen bits of data are used to represent these color components. Each of these bits is stored in SAM array 240. That is, in one implementation for a given pixel, e.g., Pixel A, the eight bits associated with the red component are stored in SAM arrays 0–7, respectively, and the eight bits associated with green are stored in SAM arrays 8–15, respectively. Thus, the sixteen arrays, collectively referred to as SAM array 240 herein, are used to represent two color components for each pixel. If another data field is desired, e.g., a blue color component, or a function such as overlay, then another VRAM is coupled to the first VRAM. Should further data fields be desired, additional VRAMS are added.

In accordance with the principles of the present invention, frame buffer A and frame buffer B may be organized within the SAM array in several ways. Each of these organizations along with the SAM address counter configuration necessary to select between frame buffer A and frame buffer B for a given pixel, is discussed in detail further below. It will be apparent to those of ordinary skill in the art that the invention is not constrained to frame buffers but can also be used to select between two or more items, such as, e.g. data elements.

Figure 3:
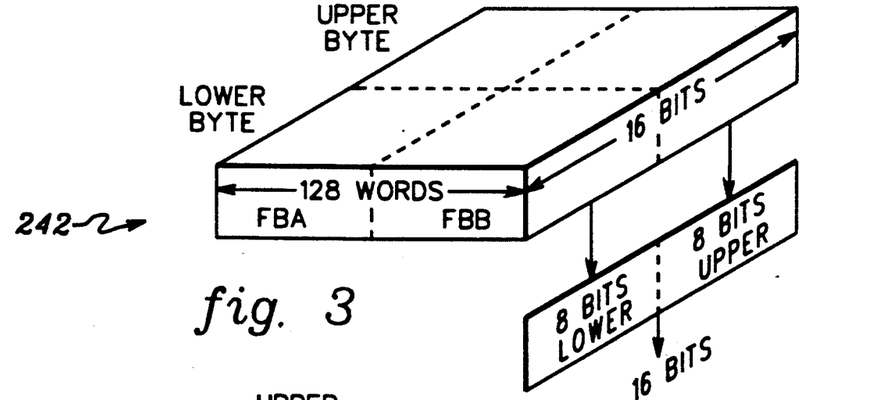
FIG. 3 is one example of a conceptual representation of a serial access memory register of the present invention.

One embodiment of a serial access memory organization of the present invention (referred to as SAM Data Select 1 (SDS1) herein) is illustrated in FIG. 3. Specifically, FIG. 3 depicts a conceptual representation of low data register 242 of SAM array 240. In this embodiment, low data register 242 is partitioned lengthwise such that frame buffer A consists of the first 64 words, i.e. words 0 through 63 and frame buffer B consists of the next 64 words, i.e. words 64–127. Each word consists of two bytes, a lower byte and an upper byte, wherein each byte is 8 bits (depthwise partition). Although not depicted, combined high data register 244 also has 128 words wherein frame buffer A consists of the first 64 words and frame buffer B consists of the next 64 words.

In order to select a byte from either frame buffer A or frame buffer B, a SAM address counter 252' (FIG. 4) is used to generate on the rising edge of each serial clock cycle the column address or addresses necessary to access the desired byte. One example of counter 252', constructed in accordance with the principles of the present invention, is depicted in FIG. 4.

Figure 4:
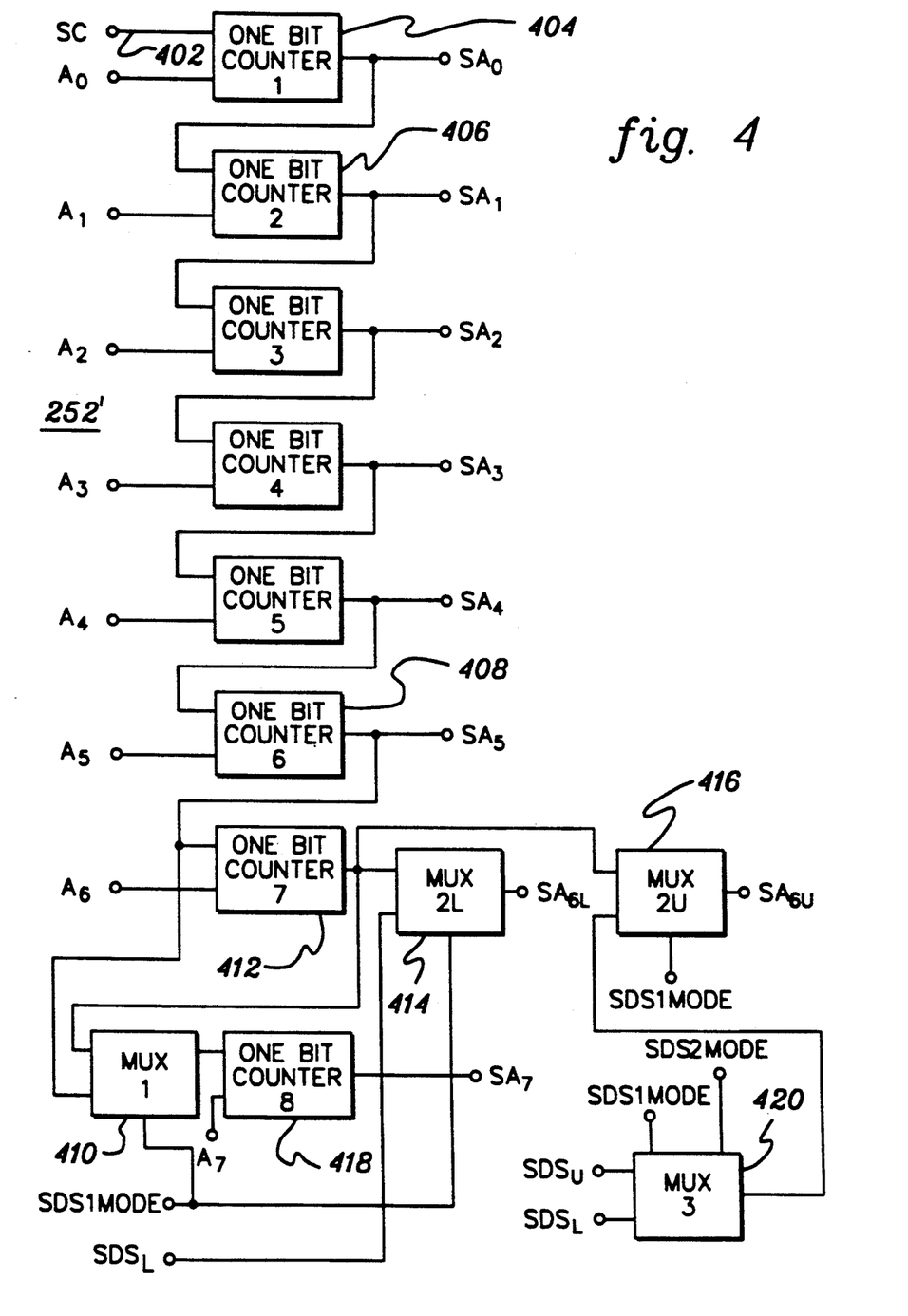
FIG. 4 is a block diagram illustrating one example of a SAM address counter, constructed in accordance with the principles of the present invention.

Illustrated in FIG. 4, are eight one bit counters, collectively referred to as counter 252'. Each one bit counter has two inputs and one output. One of the inputs consists of an address input ($A_7$-$A_0$) received from SAM address latch 250 (FIG. 2b), while the other input is, for the respective one bit counters, a serial clock signal SC on line 402, one of the outputs ($SA_5$-$SA_0$) of the preceding one bit counter, or the output of a multiplexer 410. For instance, the least significant one bit counter 404 has as its inputs serial clock signal SC and address input pin $A_0$ and as its output $SA_0$. Output $SA_0$ is then an input into the second one bit counter 406. The second input to one bit counter 406 is column address pin $A_1$ and the output is $SA_1$. The inputs for one bit counters three through seven are similar to that of one bit counter 406. However, the output of the sixth one bit counter 408 is input to both a multiplexer (MUX 1) 410 and the seventh one bit counter 412. In addition, the output of one bit counter 412 is input to multiplexer (MUX 1) 410 and multiplexers (MUX 2L) 414 and (MUX 2U) 416, which are described in further detail below.

In accordance with the principles of the present invention, in order to select data from a desired location of SAM array 240, a column address is generated. This address is dependent on a number of input signals designated $SDS_L$, $SDS_U$ and SDS1MODE (FIG. 4). $SDS_L$ is used in generating the address used to access data located in, for instance, the lower byte of the SAM array and indicates which half of, for example, low data register 242 is being accessed and therefore, whether frame buffer A or frame buffer B is being selected. $SDS_U$ is used in generating the address used to access data located in, for example, the upper byte of the SAM array and also indicates which half of, for example, low data register 242 is being accessed. (In a similar manner, $SDS_L$ and $SDS_U$ are used to indicate which half of high data register 244 is being accessed). SDS1MODE indicates whether counter 252' is operating as a standard binary counter (e.g. a look ahead or ripple counter) or in SAM data select mode. SDS1MODE may be an external signal or it may be a register on the VRAM that is set via, for example, the CBRS (CAS before RAS Refresh, with Set function.) It is apparent to those skilled in the art that although the selection of data from one of two frame buffers located in either low data register 242 or high data register 244 is described, the invention is not limited to frame buffers. The invention may be utilized anywhere it is desired to select between two or more items.

As previously mentioned, counter 252' using the inputs described above, generates addresses in order to select data from desired locations. In particular, on the first rising edge of serial clock SC, a starting column address located on input pins $A_7$-$A_0$ is clocked into counter 252'. This address determines whether data is to be selected from low data register 242 or high data register 244 of the SAM array. For instance, if the value of bit eight of the address, i.e. $CA_7$, is 0, then the data is selected from low data register 242. On the other hand, if $CA_7$ is 1, then data is selected from high data register 244.

The input signals of counter 252' are used to determine whether the counter is in SAM data select mode and whether data is to be selected from frame buffer A or frame buffer B of the SAM array. In other words, if, for instance, SDS1MODE is equal to 0, then SAM data select mode is not activated and counter 252' acts as a standard binary counter. In particular, MUX 2L (414) and MUX 2U (416) select the output of one bit counter 412 and pass this value to $SA_{6L}$ and $SA_{6U}$, respectively. In addition, MUX 1 (410) selects the output value of one bit counter 412 and passes this value to the eighth one bit counter 418. The output of one bit counter eight is $SA_7$.

If, on the other hand, SDS1MODE is equal to 1, then SAM data select mode is activated, and MUX 2L (414) selects the value of $SDS_L$ and outputs this value to $SA_{6L}$. In addition, MUX 3 (420) selects the value of $SDS_U$ which is passed to MUX 2U (416). This value is then output on $SA_{6U}$. Furthermore, MUX 1 (410) selects output value $SA_5$ and passes this value to one bit counter 418. The result of operating the counter in the above described manner is that $SA_{6L}$ and $SA_{6U}$ determine for the lower byte and upper byte, respectively, whether frame buffer A or frame buffer B is to be selected. In this embodiment, if $SDS_L$ and/or $SDS_U$ are equal to 1, then $SA_{6L}$ and/or $SA_{6U}$ are set to 1 and effectively frame buffer B is selected for that particular byte. For example, if $SDS_L = 0$ and thus $SA_{6L} = 0$ and the address is 27 in binary, then frame buffer A is selected for the lower byte of SAM register 242 (see FIG. 3). If, on the other hand, $SDS_U = 1$ and thus $SA_{6U} = 1$, then frame buffer B is selected for the upper byte of SAM register 242. It is apparent to those of ordinary skill in the art that an output pin other than $SA_6$ may be chosen for selecting between two portions of the register. For instance, if the SAM consists of 512 bits, column address bit eight is used to determine which half of the SAM is being accessed and bit 7 may be used to determine which half of the 256 bits is being accessed. It is apparent that other combinations are also possible.

Subsequent to generating each of the addresses on the first clock cycle, the addresses are coupled to SAM decoder 254 (FIG. 2b) so that the addresses may be decoded. Once decoded, they are passed to SAM array 240 in order to select data. The selected data is then output on I/O lines SD00-SD015 via SAM I/O buffer 256 and passed to e.g., a Random Access Memory Digital to Analog Converter (RAMDAC) (not shown).

Furthermore, on each subsequent serial clock cycle, counter 252' clocks and generates new addresses, in accordance with the principles of the present invention described above. That is, on the rising edge of each subsequent serial clock cycle, an address is generated to access data in the lower byte of the SAM array and another address is generated to access data in the upper byte of the SAM array. These addresses may be the same or different. It is apparent to those skilled in the art that the invention is not limited to the generation of two addresses. For example, it is possible to generate one address to access data in the SAM or additional SDS pins may be added to provide nibble granularity in a 16-bit device.

As described above, in one embodiment, half of low data register 242 and half of high data register 244 correspond to frame buffer A and each of the other halves correspond to frame buffer B. This memory organization along with the counter configuration described above enables the selection of frame buffer A or frame buffer B for each byte of a pixel on a per serial clock cycle basis. As previously described, the invention is not limited, however, to frame buffers.

Figures 5, 7:
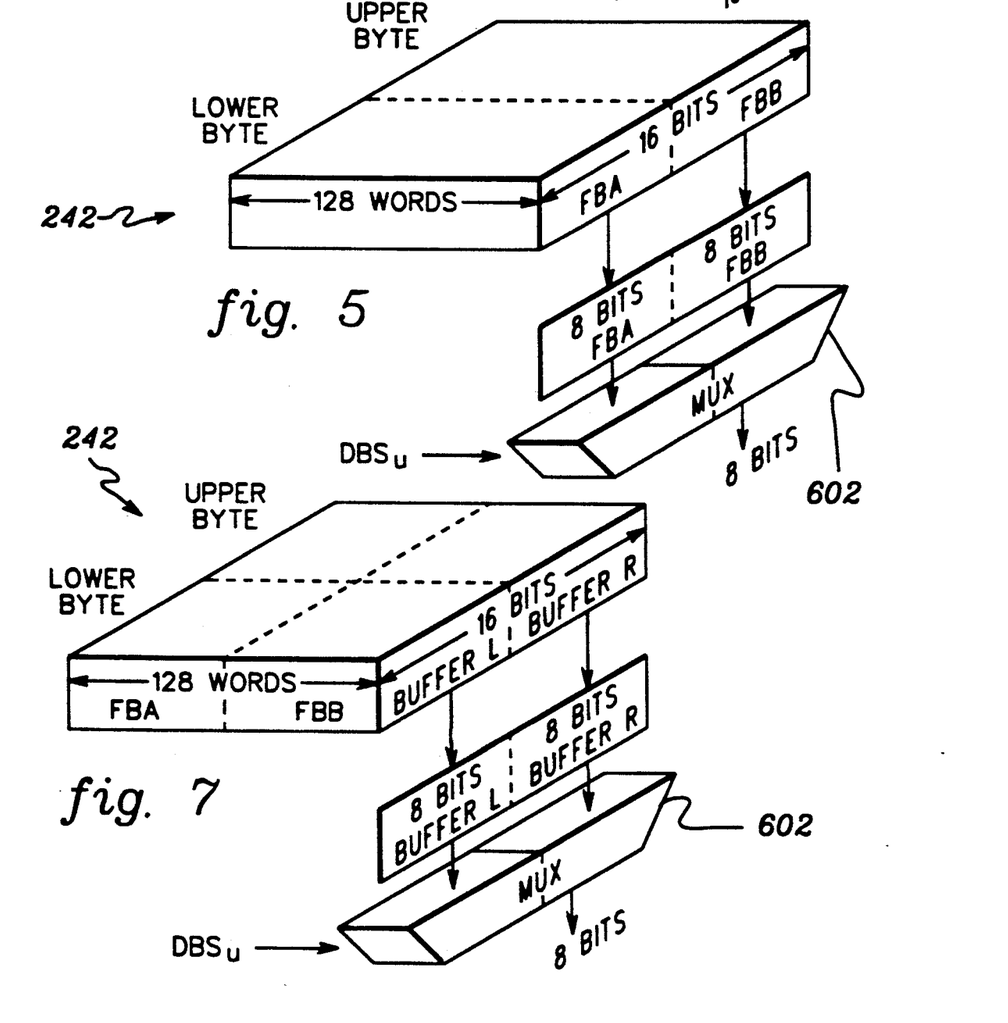
FIG. 5 is another example of a conceptual representation of a serial access memory register of the present invention.
FIG. 7 is a further example of a conceptual representation of a serial access memory register of the present invention.

In another embodiment (referred to as SDS2 for convenience herein), SAM register 242 is organized as depicted in the conceptual representation of FIG. 5. (As described above, SAM register 244 is organized in a similar manner.) Referring to FIG. 5, it is shown that the lower byte of a selected word represents frame buffer A and the upper byte represents frame buffer B (depthwise partition). This has the advantage of allowing the VRAM to appear as two 8-bit devices in a single package, thereby providing full byte-granularity. Once again, the lower and upper bytes need not represent frame buffers.

As with the previously described embodiment, counter 252' is used to generate addresses on the rising edge of each serial clock cycle to select data from particular locations. In this embodiment, however, counter 252' behaves like a standard binary counter. In particular, when this embodiment is desired, SDS1MODE is set equal to 0. Therefore, MUX 1 (410) selects as its input the output of one bit counter 412 and passes this value to one bit counter 418. In addition, MUX 2L (414) and MUX 2U (416) each select as its input the output of one bit counter 412. Therefore, counter 252' operates as a standard binary counter and generates addresses for the lower byte and the upper byte. In this embodiment, the generated addresses are the same. The addresses are then decoded and transferred to SAM register 242 in order to access sixteen bits of data. The sixteen bits of data are output on I/O lines SD00-SD015 (FIG. 2b). However, unlike the previous embodiment, in this embodiment only eight bits of data are passed to the serial output port. Therefore, a MUX 602 (FIG. 6) is used to select either the lower byte or the upper byte of data. In one example, the lower byte is associated with frame buffer A and the upper byte is associated with frame buffer B. However, it is apparent to those of ordinary skill in the art that the lower and upper bytes need not represent frame buffers. They can merely represent two pieces of data or other entities in which one of the two may be selected.

Figure 6:
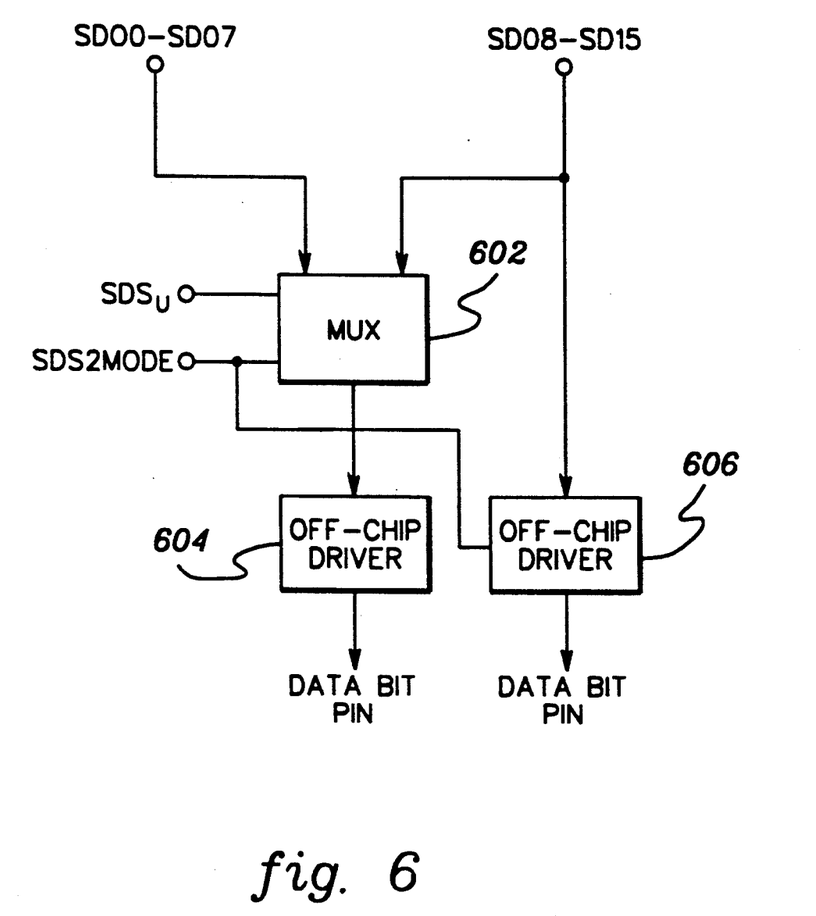
FIG. 6 is a schematic representation illustrating the selection of eight of sixteen data bits, in one embodiment of the present invention.

Referring to FIG. 6, the manner in which MUX 602 selects either the lower byte or the upper byte will now be described. The inputs to MUX 602 are signals SDS2MODE and $SDS_U$. SDS2MODE indicates whether SDS2 is activated and as with SDS1MODE it may be an external pin or a register on the VRAM. $SDS_U$ indicates whether the lower byte or the upper byte is being selected. For instance, when SDS2MODE is equal to 0, SDS2 is not activated and MUX 602 selects the data from the lower byte of the SAM register and passes this information to a standard off-chip driver 604. Driver 604 drives the bits representing the lower byte of data off of the SAM array. Similarly, a standard off-chip driver 606 is used to drive the bits representing the upper byte of data off of the SAM array.

On the other hand, when SDS2MODE is equal to 1, only eight bits of data are read out of the serial port and thus, the lower byte or upper byte is selected for reading. Signal $SDS_U$ is used to determine which byte is to be selected. In particular, if the value of $SDS_U$ is 0, then MUX 602 selects bits 0-7 corresponding to the lower byte, and if the value of $SDS_U$ is 1, then bits 8-15 (upper byte) are selected. The selected byte is transferred to off-chip driver 604 which drives the bits off of the SAM register. As is known, this information may then be passed to, for example, a RAMDAC. Note that in this example, when SDS2MODE is 1, off-chip driver 606 is not utilized and, therefore, may be placed in a high impedance state.

In yet another embodiment of the present invention (referred to herein as SDS3), each SAM register is organized similar to SDS1 in that the first 64 words of the low data register (0-63) represent frame buffer A and the next 64 words (64-128) represent frame buffer B (lengthwise partition). In addition, the lower byte of the SAM register represents a left buffer, BUFFER L and the upper byte represents a right buffer, BUFFER R (FIG. 7) (depthwise partition). It will be apparent to one of ordinary skill in the art, that these bytes need not represent buffers but could represent other elements. The SDS3 organization advantageously allows the access of two buffers or data items per cycle on the random access side and the scanning out of one buffer or data item per cycle on the serial side.

Once again, in order to select data from the SAM register, counter 252' is utilized for generating on the rising edge of each serial clock cycle the addresses necessary for accessing the data. It is apparent to those of ordinary skill in the art that the invention is not limited to this counter configuration but that other configurations may be utilized without departing from the spirit of the invention. Further, it is apparent that the addresses need not be generated on the rising edge of the clock cycle but could, for example, be generated on the falling edge. In these embodiments, counter 252' is preferred, since it may be used with a number of memory organizations thereby providing versatility.

In this third embodiment, the input signals utilized are designated SDS1MODE, SDS2MODE, $SDS_L$ and $SDS_U$. In particular, SDS1MODE and SDS2MODE are set equal to 1, thereby instructing the counter that SAM data select corresponding to SDS3 is desired. As described with reference to SDS1, when SDS1MODE is set equal to 1, MUX 2L (414) selects the value of $SDS_L$ and outputs this value to $SA_{6L}$. In addition MUX 410 selects output value $SA_5$ and passes this value to one bit counter eight. Unlike SDS1, however, when SDS1MODE and SDS2MODE are equal to 1, MUX 3 (420) selects the value of $SDS_L$ which is passed to MUX 2U (416). This value is output on $SA_{6U}$. The result of operating counter 252' in the above described manner is that $SA_{6L}$ and $SA_{6U}$ representing the lower byte and upper byte respectively, have the same value. It will be apparent to those skilled in the art, however, that in another example, $SA_{6L}$ and $SA_{6U}$ may have different values. Subsequent to generating the addresses for the lower byte and the upper byte, the addresses are decoded and transferred to the SAM register in order to access sixteen bits of data. However, as with SDS2, only eight bits of data are passed to the serial output port. Therefore, MUX 602 is used to select either the lower byte or upper byte of data.

Referring again to FIG. 6, $SDS_U$ is once again used to indicate whether the lower byte or the upper byte of data is being selected. For instance, when the value of $SDS_U$ is 0, then MUX 602 selects bits 0-7 corresponding to the lower byte of data, and if the value of $SDS_U$ is 1, then bits 8-15 are selected. The selected byte is transferred to off-chip driver 604, as defined previously.

Although preferred embodiments have been depicted and described in detail herein, it will be apparent to those skilled in the relevant art that various modifications, additions, substitutions and the like can be made without departing from the spirit of the invention, and these are therefore considered to be within the scope of the invention as recited in the appended claims.

What is claimed is:

1. A dual-port memory, comprising:
   a random access memory means having a plurality of rows and columns of data elements, each of said rows being accessed at random by a row address;
   a first serial access memory means, said first serial access memory means receiving a first portion of an accessed row of the data elements from said random access memory means;
   a second serial access memory means, said second serial access memory means receiving a second portion of the accessed row of the data elements from said random access memory means;
   means for selecting one of said first serial access memory means and said second serial access memory means for serial data readout;
   means for generating a first address to access a first plurality of data elements from said selected serial access memory means such that a first sequence of access elements is provided;
   means for generating a second address to access a second plurality of data elements from said selected serial access memory means such that a second sequence of accessed elements is provided, said first and second sequences being provided during a single clock cycle;
   means for selecting one of said first sequence and said second sequence of accessed elements to be output on a serial output port, said means for selecting one of said first sequence and said second sequence including means for arbitrarily selecting on successive clock cycles a particular one of said first sequence and said second sequence of access elements; and
   means for outputting said selected sequence of elements on said serial output port.

2. The dual-port memory of claim 1, wherein said first address has the same value as said second address.

3. The dual-port memory of claim 2, wherein said selected serial access memory means is partitioned depthwise into a first region and a second region and wherein said first sequence of accessed elements comprises data elements from said first region and said second sequence of accessed elements comprises data elements from said second region, said first region comprising a first plurality of registers and said second region comprising a second plurality of registers.

4. The dual-port memory of claim 3, wherein said selected serial access memory means is further partitioned lengthwise into a first section and a second section and said first sequence of accessed elements and said second sequence of accessed elements are both selected from one of said first section and said second section.

5. The dual-port memory of claim 3, wherein said first sequence of accessed elements represents a first frame buffer and said second sequence of accessed elements represents a second frame buffer.

6. The dual-port memory of claim 1, wherein said first address generating means and said second address generating means comprise a counter for serially accessing data elements, said counter responding to a first control signal used to generate said first address and a second control signal used to generate said second address.

7. The dual-port memory of claim 1, wherein said selected serial access memory means is partitioned lengthwise into a first section and a second section and on each successive clock cycle said first sequence of accessed elements and said second sequence of accessed elements are each arbitrarily selected from one of said first section and said second section.

8. A method of serially accessing data elements stored in a memory array, said array having a plurality of rows and columns of the data elements, said method comprising the steps of:
   accessing a row of data elements from said memory array at random by a row address;
   loading a first portion of an accessed row of the data elements from said memory array to a first serial access memory register;
   loading a second portion of said accessed row of the data elements from said memory array to a second serial access memory register;
   selecting one of said first register and said second register for serial data readout;
   generating a first address to access a first plurality of data elements from said selected register such that a first sequence of accessed data elements is provided;
   generating a second address to access a second plurality of data elements from said selected register such that a second sequence of accessed data elements is provided said first and second sequences being provided during a single clock cycle;
   selecting one of said first sequence and said second sequence of elements to be output on a serial output port, a particular one of said first sequence and said second sequence being arbitrarily selected on successive clock cycles; and
   outputting said selected sequence of elements to the serial output port.

9. The method of claim 8, wherein said first address generating step and said second address generating step comprise providing a first input signal and a second input signal to a counter, said counter responding to said first input signal to generate said first address and said second input signal to generate said second address.

10. The method of claim 8, wherein said selected register is partitioned lengthwise into a first section and a second section and on each successive clock cycle said first sequence of accessed elements and said second sequence of access elements are each arbitrarily selected from one of said first section and said second section.

11. A dual-port memory, comprising:
   a random access memory means having a plurality of rows and columns of data elements, each of said rows being accessed at random by a row address;
   a first serial access memory means, said first serial access memory means receiving a first portion of an accessed row of the data elements from said random access memory means;
   a second serial access memory means, said second serial access memory means receiving a second portion of the accessed row of the data elements from said random access memory means;
   means for selecting one of said first serial access memory means and said second serial access memory means for serial data readout;
   means for generating a first address to access a plurality of data elements from said selected serial access memory means such that a first sequence of accessed elements is provided;

means for generating a second address to access a plurality of data elements from said selected serial access memory means such that a second sequence of accessed elements is provided, said first and second sequences being provided during a single clock cycle; and means for outputting said first sequence of elements and said second sequence of elements on a serial output port.

12. The dual-port memory of claim 11, wherein said second address differs from said first address by a predetermined value.

13. The dual-port memory of claim 12, wherein said selected serial access memory means is partitioned depthwise into a first region and a second region and said first sequence of accessed elements is selected from said first region and said second sequence of accessed elements is selected from said second region.

14. The dual-port memory of claim 13, wherein said selected serial access memory means is further partitioned lengthwise into a first section and a second section.

15. The dual-port memory of claim 14, wherein said first section represents a first frame buffer and said second section represents a second frame buffer.

16. The dual-port memory of claim 11, wherein said selected serial access memory means is partitioned lengthwise into a first section and a second section and on each successive clock cycle said first sequence of accessed elements and said second sequence of accessed elements are each arbitrarily selected from one of said first section and said second section.

17. A method of serially accessing data elements stored in a memory array, said array having a plurality of rows and columns of the data elements, said method comprising the steps of:

accessing a row of data elements from said memory array at random by a row address;

loading a first portion of an accessed row of the data elements from said memory array to a first serial access memory register;

loading a second portion of said accessed row of the data elements from said memory array to a second serial access memory register;

selecting one of said first register and said second register for serial data readout;

generating during a single clock cycle a first address to access a plurality of data elements from said selected register such that a first sequence of accessed data elements is provided;

generating during said single clock cycle a second address to access a plurality of data elements from said selected register such that a second sequence of accessed data elements is provided; and outputting said first and second sequences of elements on a serial output port.

18. The method of claim 14, wherein said selected register is partitioned lengthwise into a first section and a second section and on each successive clock cycle said first sequence of accessed elements and said second sequence of accessed elements are each arbitrarily selected from one of said first section and said second section.

* * * * *

UNITED STATES PATENT AND TRADEMARK OFFICE
CERTIFICATE OF CORRECTION

PATENT NO. : 5,257,237
DATED : October 26, 1993
INVENTOR(S) : Aranda et al.

It is certified that error appears in the above-indentified patent and that said Letters Patent is hereby corrected as shown below:

Column 14, line 25, delete "14" and substitute therefor --17--.

Signed and Sealed this

Nineteenth Day of April, 1994

Attest:

BRUCE LEHMAN

Attesting Officer     Commissioner of Patents and Trademarks